(12) United States Patent
Fujihara

(10) Patent No.: US 11,249,132 B2
(45) Date of Patent: Feb. 15, 2022

(54) PROBER AND METHOD OF PREHEATING PROBE CARD

(71) Applicant: TOKYO ELECTRON LIMITED, Tokyo (JP)

(72) Inventor: Jun Fujihara, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/910,439

(22) Filed: Jun. 24, 2020

(65) Prior Publication Data

US 2020/0408835 A1 Dec. 31, 2020

(30) Foreign Application Priority Data

Jun. 27, 2019 (JP) .............................. JP2019-120236

(51) Int. Cl.
*G01R 31/28* (2006.01)
*G01R 1/073* (2006.01)

(52) U.S. Cl.
CPC ..... *G01R 31/2875* (2013.01); *G01R 1/07314* (2013.01); *G01R 31/2863* (2013.01); *G01R 31/2887* (2013.01)

(58) Field of Classification Search
CPC ............ G01R 31/2874; G01R 31/2875; G01R 31/2877
See application file for complete search history.

(56) References Cited

U.S. PATENT DOCUMENTS

| | | | | |
|---|---|---|---|---|
| 2009/0096475 A1* | 4/2009 | Yamamoto | ......... | G01R 31/2875 324/750.28 |
| 2010/0164520 A1* | 7/2010 | Kiyofuji | ............ | G01R 31/2875 324/756.03 |

FOREIGN PATENT DOCUMENTS

JP 2017-69428 A 4/2017

* cited by examiner

*Primary Examiner* — Tung X Nguyen
(74) *Attorney, Agent, or Firm* — Nath, Goldberg & Meyer; Jerald L. Meyer; Tanya E. Harkins

(57) ABSTRACT

There is provided a prober including inspection rooms. Each of the inspection rooms includes: a probe card having probes; a chuck top configured to mount a wafer; and a temperature adjuster configured to adjust a temperature of the chuck top. At least one of the probe card and the chuck top includes a gap adjustment member configured to maintain a constant gap between the probe card and the chuck top. The probe card is preheated by heat of the chuck top whose temperature is adjusted by the temperature adjuster, in a state in which the wafer is not mounted on the chuck top and in a state in which the probe card and the chuck top are connected with each other via the gap adjustment member.

6 Claims, 10 Drawing Sheets

PROBER AND METHOD OF PREHEATING PROBE CARD

CROSS-REFERENCE TO RELATED APPLICATION

This application is based upon and claims the benefit of priority from Japanese Patent Application No. 2019-120236, filed on Jun. 27, 2019, the entire contents of which are incorporated herein by reference.

TECHNICAL FIELD

The present disclosure relates to a prober and a preheating method for a probe card.

BACKGROUND

A prober is an example of an inspection device for inspecting a wafer on which numerous semiconductor devices are formed. The prober includes a probe card having probes which are columnar contact terminals. In the prober, each probe is brought into contact with an electrode pad or a solder bump in a semiconductor device by bringing the wafer into contact with the probe card. Further, the prober inspects, for example, a conduction state of an electric circuit of the semiconductor device by allowing electricity to flow from each probe to the electric circuit connected to each electrode pad or each solder bump.

PRIOR ART DOCUMENTS

Patent Document

Patent Document 1: Japanese laid-open publication No. 2017-069428

SUMMARY

According to one embodiment of the present disclosure, there is provided a prober including inspection rooms. Each of the inspection rooms includes: a probe card having probes; a chuck top configured to mount a wafer; and a temperature adjuster configured to adjust a temperature of the chuck top. At least one of the probe card and the chuck top includes a gap adjustment member configured to maintain a constant gap between the probe card and the chuck top. The probe card is preheated by heat of the chuck top whose temperature is adjusted by the temperature adjuster, in a state in which the wafer is not mounted on the chuck top and in a state in which the probe card and the chuck top are connected with each other via the gap adjustment member.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of a prober and a preheating method for a probe card will now be described in detail with reference to the drawings. The disclosed technique is not limited to the following embodiments.

In recent years, in order to improve wafer inspection efficiency, a prober has been developed, which includes inspection rooms and can inspect semiconductor devices on a wafer in one inspection room while a wafer is transferred to another inspection room by a transfer device. In this prober, when a wafer is brought into contact with a probe card, the wafer is mounted on a chuck top and the wafer is brought into contact with the probe card by vacuuming a space between the probe card and the chuck top. In this case, when the wafer is brought into contact with the probe card, the chuck top is placed on its stage so that the stage moves the chuck top toward the probe card. Thereafter, the chuck top is adsorbed to the probe card and separated from the stage.

In recent years, however, inspection conditions for wafer inspection have become more complicated, and in particular, many inspections have been performed in high-temperature and low-temperature environments. In such cases, it is required to perform preheating for setting the probe card to an inspection temperature before the inspection of the wafer. Since the preheating of the probe card is performed by, for example, radiant heat from the chuck top, the positional relationship between the probe card and the chuck top is important. Therefore, in the present disclosure, the probe card is preheated while maintaining a constant gap between the probe card and the chuck top.

[Configuration of the Prober]

Figure 1:
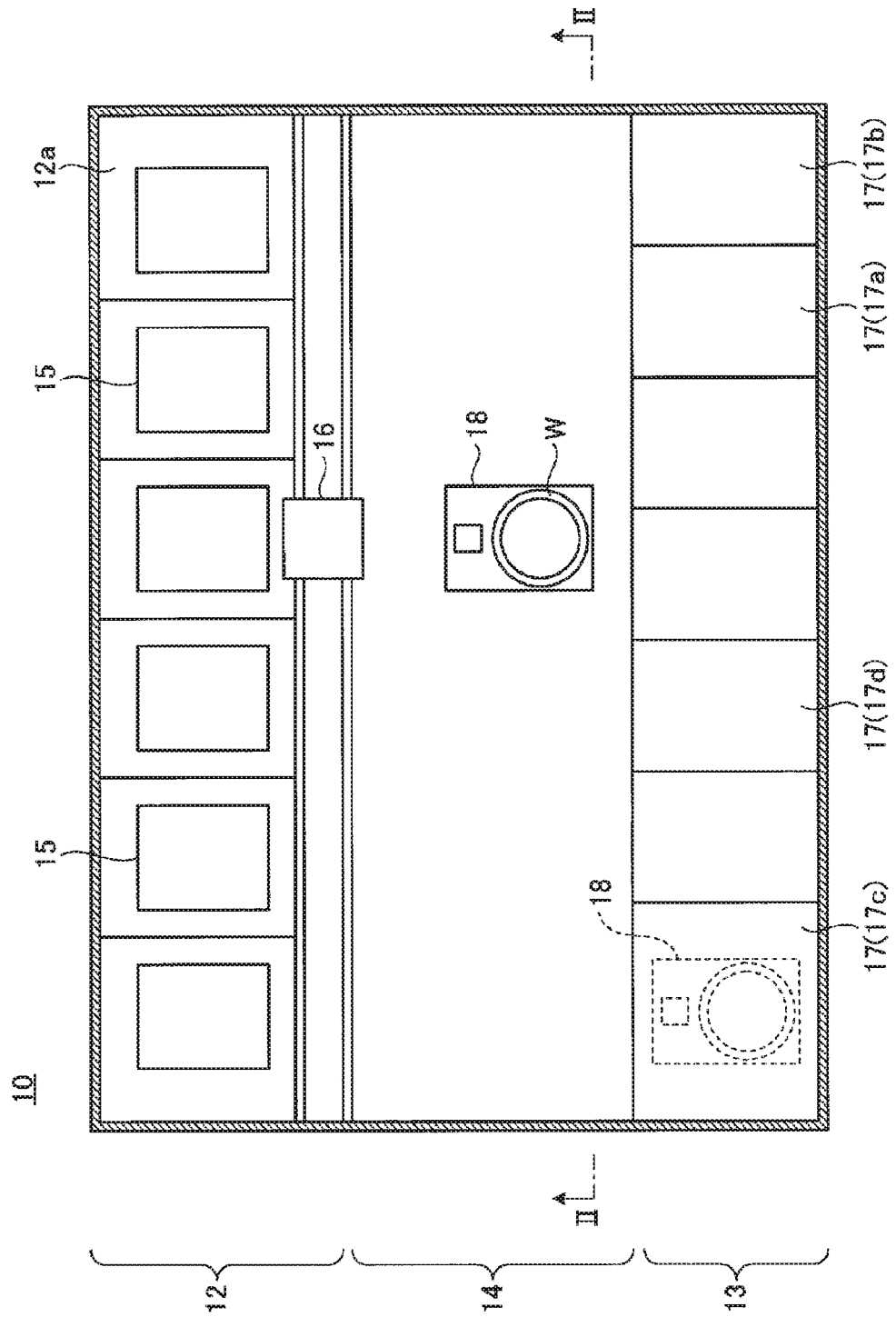
FIG. 1 is a diagram illustrating an example of a prober according to a first embodiment of the present disclosure.
Figure 2:
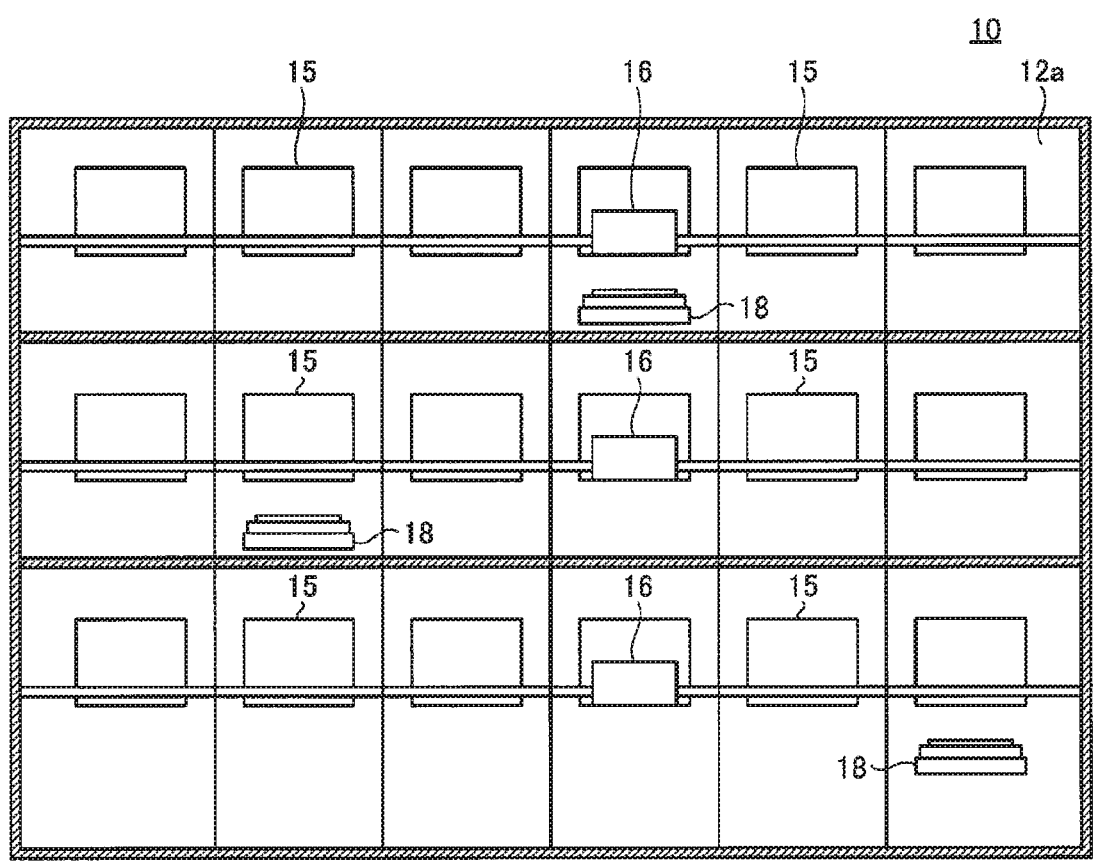
FIG. 2 is a cross-sectional view taken along line II-II in FIG. 1.

FIG. 1 is a diagram illustrating an example of a prober according to a first embodiment of the present disclosure. FIG. 2 is a cross-sectional view taken along line II-II in FIG. 1. A prober 10 illustrated in FIGS. 1 and 2 has an inspection region 12 for inspecting electrical characteristics of each semiconductor device of a wafer W, an accommodation region 13 for accommodating the wafer W. and a transfer region 14 installed between the inspection region 12 and the accommodation region 13.

In the inspection region 12, testers 15 as interfaces for wafer inspection are arranged, and inspection rooms 12a corresponding to the respective testers 15 are installed. Specifically, the inspection region 12 has a three-layer structure of tester rows consisting of horizontally arranged testers, and one tester side camera 16 is arranged corresponding to each tester row. Each tester side camera 16 horizontally moves along the corresponding tester row, and is located in front of each tester 15 to confirm the position of the wafer W or the like and the degree of inclination of a chuck top 29.

The accommodation region 13 is partitioned into accommodation spaces 17. A port 17a, an aligner 17b, a loader 17c, and a controller 17d are arranged in the respective accommodation spaces 17. The port 17a receives a FOUP, which is a vessel that accommodates the wafers. The aligner 17b aligns the wafers. A probe card 19 is loaded into and unloaded from the loader 17c. The controller 17d controls operations of respective components.

A transfer device 18 freely movable to the inspection region 12 and the accommodation region 13 is arranged in the transfer region 14. The transfer device 18 receives the wafers W from the port 17a and transfers the same to each inspection room 12a, and also transfers wafers W after the inspection of electrical characteristics of semiconductor devices is completed from each inspection room 12a to the port 17a.

While the transfer device 18 transfers one wafer W between one inspection room 12a and the port 17a, another inspection room 12a can perform the inspection of electrical characteristics of each semiconductor device of another wafer W. Therefore, the wafer inspection efficiency can be improved.

Figure 3:
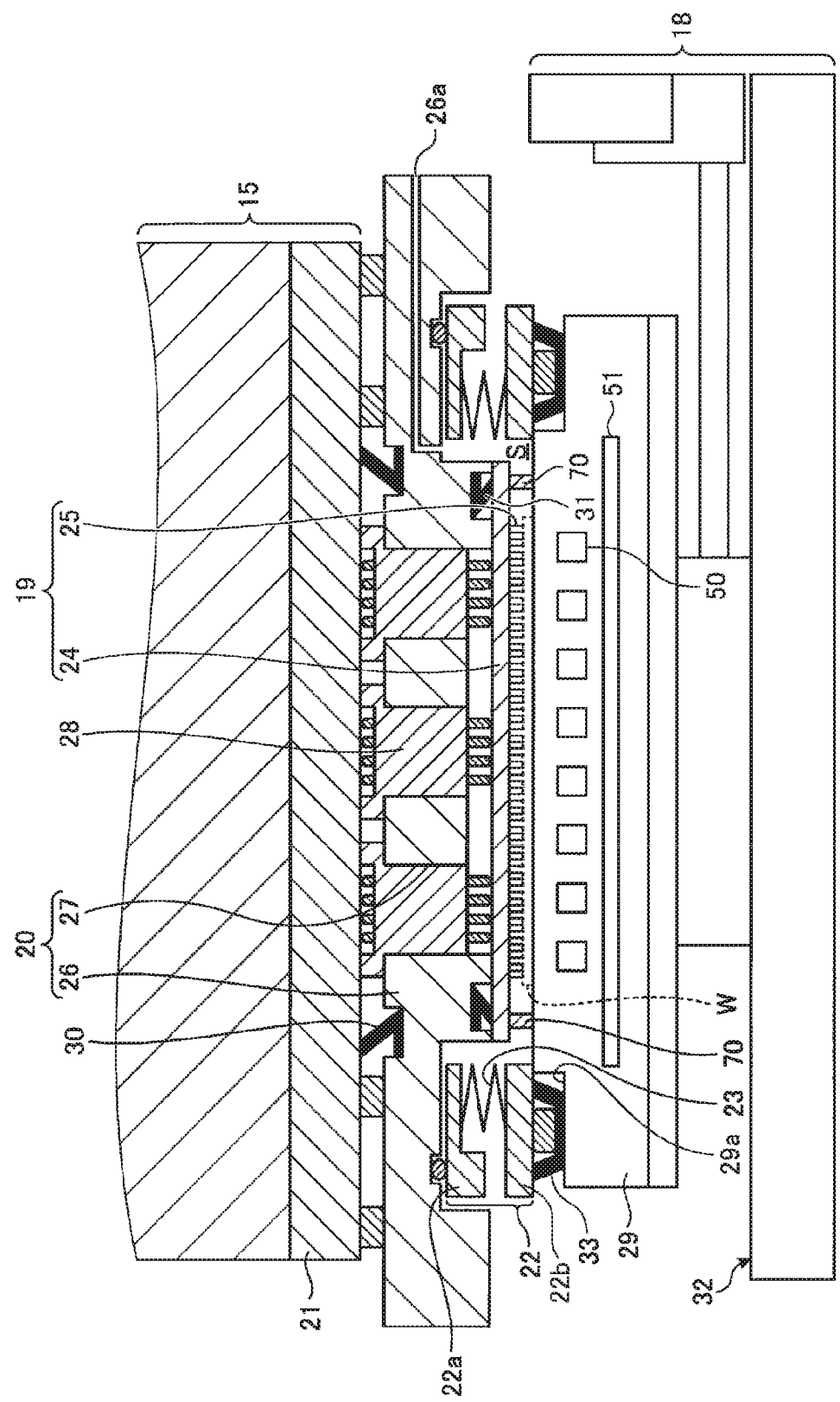
FIG. 3 is a diagram illustrating an example of a configuration of a prober when a wafer is not mounted on a chuck top according to the first embodiment.
Figure 4:
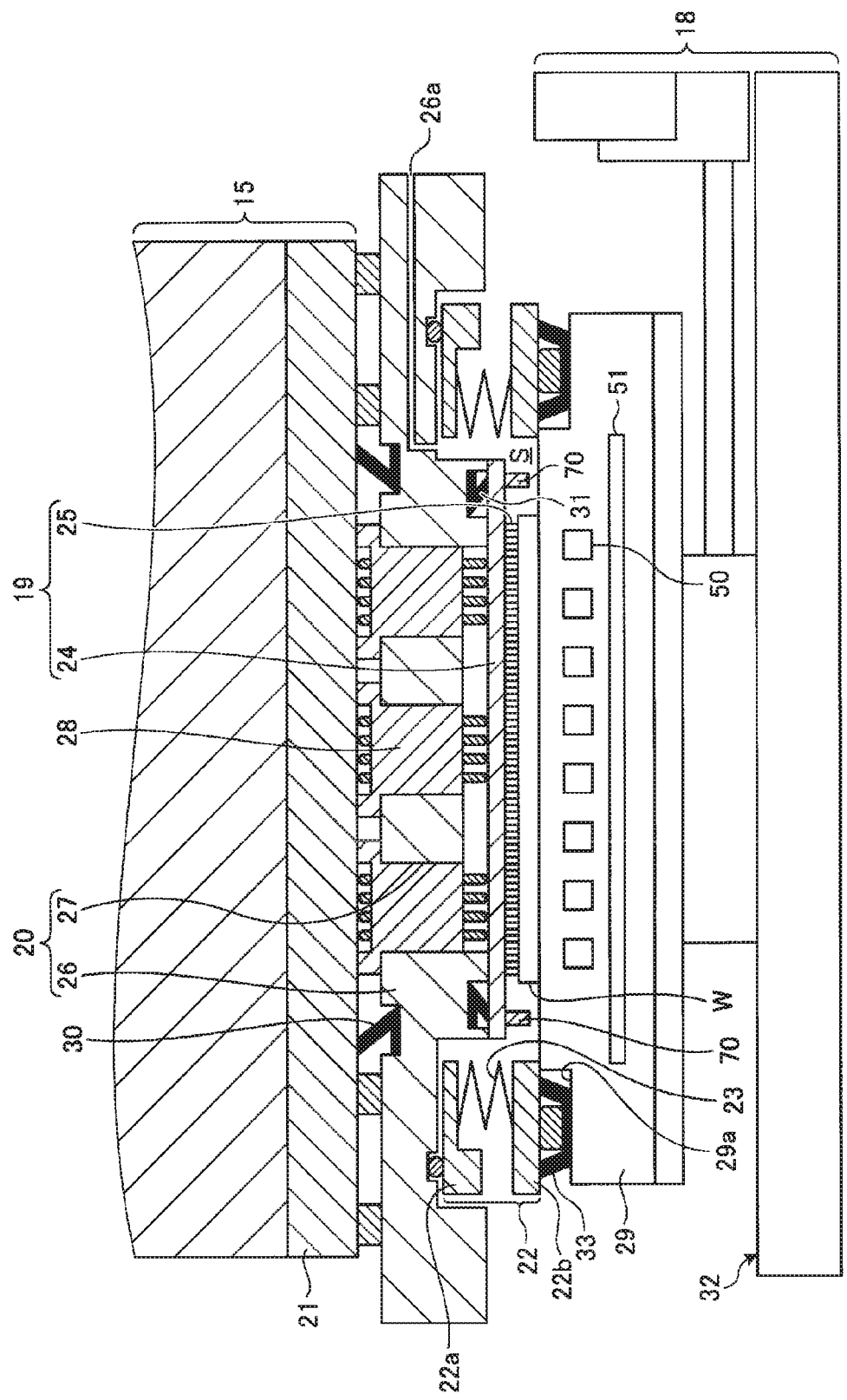
FIG. 4 is a diagram illustrating an example of a configuration of a prober when the wafer is mounted on the chuck top according to the first embodiment.

FIG. 3 is a diagram illustrating an example of a configuration of a prober when a wafer is not mounted on the chuck top according to the first embodiment. Further, FIG. 3 illustrates a state where a wafer W is not mounted in order to preheat the probe card 19. That is, FIG. 3 illustrates a state where the chuck top 29 is brought into contact with gap adjustment members 70 installed on the probe card 19, in which the configuration of the inspection room 12a is mainly shown in a cross-sectional view. Further, FIG. 4 is a diagram illustrating an example of a configuration of a prober when a wafer is mounted on the chuck top according to the first embodiment. That is, FIG. 4 illustrates a state where the wafer W is brought into contact with the probe card 19, in which the configuration of the inspection room 12a is mainly shown in a cross-sectional view.

In FIGS. 3 and 4, the tester 15 is installed on a pogo frame 20 fixed to a device frame (not shown). The probe card 19 is installed under the pogo frame 20. A flange 22 is arranged so as to surround the probe card 19.

The probe card 19 has a disc-shaped main body 24, electrodes (not shown) arranged over substantially the entire upper surface of the main body 24, and probes 25 arranged so as to protrude downward from a lower surface of the main body 24. Each electrode is connected to each corresponding probe 25. When the wafer W is brought into contact with the probe card 19, each probe 25 is brought into contact with an electrode pad or a solder bump of each semiconductor device formed on the wafer W.

Furthermore, the probe card 19 has the gap adjustment members 70 for maintaining a constant gap between the probe card 19 and the chuck top 29 when the wafer W is not mounted on the chuck top 29. The gap adjustment members 70 each have, for example, a pin shape, and are made of stainless steel, aluminum, or copper, and three or more gap adjustment members 70 may be installed on a lower surface of the probe card 19. The gap adjustment members 70 may be made of, for example, a resin such as a polyether ether ketone (PEEK) material, another material, an alloy, or the like. A length of the gap adjustment members 70 is longer than that of the probes 25 and is shorter than a distance from a lower surface of the main body 24 of the probe card 19 to an upper surface of the chuck top 29 in a state where the probes 25 are brought into contact with the wafer W when the wafer W is mounted on the chuck top 29.

That is, as illustrated in FIG. 3, the gap adjustment members 70 are brought into contact with the chuck top 29 when the wafer W is not mounted. On the other hand, as illustrated in FIG. 4, the gap adjustment members 70 are in a state where there is a gap between the gap adjustment members 70 and the chuck top 29 when the wafer W is mounted on the chuck top 29. In other words, the probes 25 are not brought into contact with the chuck top 29 when the wafer W is not mounted on the chuck top 29, while the probes 25 are brought into contact with the wafer W when the wafer W is mounted on the chuck top 29.

The pogo frame 20 has a substantially flat plate-shaped body 26, and pogo block insertion holes 27 which are through holes formed to penetrate a vicinity of a central portion of the body 26. A pogo block 28 formed by arranging numerous pogo pins is inserted into each pogo block insertion hole 27. The pogo block 28 is connected to an inspection circuit (not shown) included in the tester 15 and is brought into contact with numerous electrodes in an upper surface of the main body 24 of the probe card 19 installed on the pogo frame 20. The pogo block 28 allows a current to flow through each probe 25 of the probe card 19 connected to the electrodes, and also allows the current flowing from the electric circuit of each semiconductor device of the wafer W via each probe 25 to flow toward the inspection circuit.

The flange 22 has an upper flange 22a and a lower flange 22b. In addition, the flange 22 has a cylindrical bellows 23 between the upper flange 22a and the lower flange 22b. The upper flange 22a is engaged with the pogo frame 20 and is sealed with packing or the like. The lower flange 22b is freely movable in the vertical direction with respect to the pogo frame 20.

The lower flange 22b moves downward so that the lower surface of the lower flange 22b is located below the tip of each probe 25 of the probe card 19 by its own weight until the chuck top 29 is brought into contact with it. The bellows 23 is a metallic bellows structure and is configured so as to be freely expanded and contracted in the vertical direction. The lower end and the upper end of the bellows 23 are brought into close contact with the upper surface of the lower flange 22b and the lower surface of the upper flange 22a, respectively.

A space between the pogo frame 20 and a base 21 of the tester 15 is sealed by a seal member 30, and the base 21 is installed on the pogo frame 20 by vacuuming the space. A space between the pogo frame 20 and the probe card 19 is also sealed by a seal member 31, and the probe card 19 is installed on the pogo frame 20 by vacuuming the space.

The transfer device 18 has an aligner 32. The chuck top 29 is placed on the aligner 32, and the wafer W is mounted on the upper surface of the chuck top 29. Furthermore, in FIG. 3, the wafer W is not mounted, and the mounting position is indicated by a broken line. The chuck top 29 is vacuum-adsorbed to the aligner 32, and the wafer W is vacuum-adsorbed to the chuck top 29. Thus, the wafer W can be prevented from relatively moving to the transfer device 18 when the transfer device 18 moves. The method of holding the chuck top 29 and the wafer W is not limited to the vacuum adsorption, and may be any method as long as it can prevent relative movement of the chuck top 29 and the wafer W with respect to the aligner 32. For example, the holding method may be a holding method by electromagnetic adsorption or clamp. In addition, a step 29a is formed on a peripheral portion of the upper surface of the chuck top 29, and a seal member 33 is arranged on the step 29a.

Furthermore, the chuck top 29 has a flow passage 50 and a heater 51 installed therein. Refrigerant is supplied from a chiller unit (not shown) to the flow passage 50. The refrigerant supplied to the flow passage 50 flows through the flow passage 50 and is then returned to the chiller unit. A heater power source (not shown) is connected to the heater 51, and the chuck top 29 is heated by supplying electric power to the heater 51. The temperature of the chuck top 29 is adjusted by cooling by the refrigerant circulating in the flow passage 50 and heating by the heater 51.

The transfer device 18 can move below the probe card 19 in the inspection room 12a to face the wafer W mounted on the chuck top 29 to the probe card 19 and move the wafer W toward the probe card 19. A space S is a space formed when the gap adjustment members 70 are brought into contact with the mounting surface of the chuck top 29 (FIG. 3) or when the chuck top 29 is brought into contact with the lower flange 22b and the wafer W is brought into contact with the probe card 19 (FIG. 4). The space S is sealed by the bellows 23 and the seal member 33. In the space S, the chuck top 29 is held on the probe card 19 side by vacuuming the space S via a vacuum line 26a. The method of holding the chuck top 29 is not limited to the vacuum adsorption, and may be any method as long as it can form the space S. For example, the holding method may be a holding method by electromagnetic adsorption or clamp. Furthermore, the movement of the transfer device 18 is controlled by the controller 17d, which identifies the position and the amount of movement of the transfer device 18.

The aligner 32 adjusts the relative position and inclination of the chuck top 29 with respect to the probe card 19. A temperature adjuster such as the flow passage 50 or the heater 51 implements the inspection in high-temperature and low-temperature environments. Therefore, the aligner 32 adjusts the position and inclination of the probe card 19 and the chuck top 29 according to deformation of the probe card 19 and the chuck top 29 by heat radiation from the heater 51 and heat absorption to the flow passage 50 in the inspection under the high-temperature and low-temperature environments. The temperature range of the chuck top 29 may be a range of, for example, 130 degrees C. to −30 degrees C.

The aligner 32 has bases and a rail-shaped guides which correspond to each of X, Y, and Z directions. Each base is movable along each guide. A substantially disc-shaped chuck base is installed in a Z block installed on the Z base. The chuck base has a chuck top adsorption surface on its upper surface, and the chuck top 29 is vacuum-adsorbed onto the chuck top adsorption surface. Thus, the chuck top 29 is installed to be placed on the aligner 32. At this time, the position of the chuck top 29 relative to the chuck base is specified by using a positioning pin, a positioning block, or the like.

In addition, the aligner 32 has an upward confirmation camera for confirming the degree of inclination of the probe card 19 and the pogo frame 20. Furthermore, the aligner 32 can adjust the inclination of the placed chuck top 29 by lifting the chuck base using an actuator.

[Preheating Method for the Probe Card]

Figure 5:
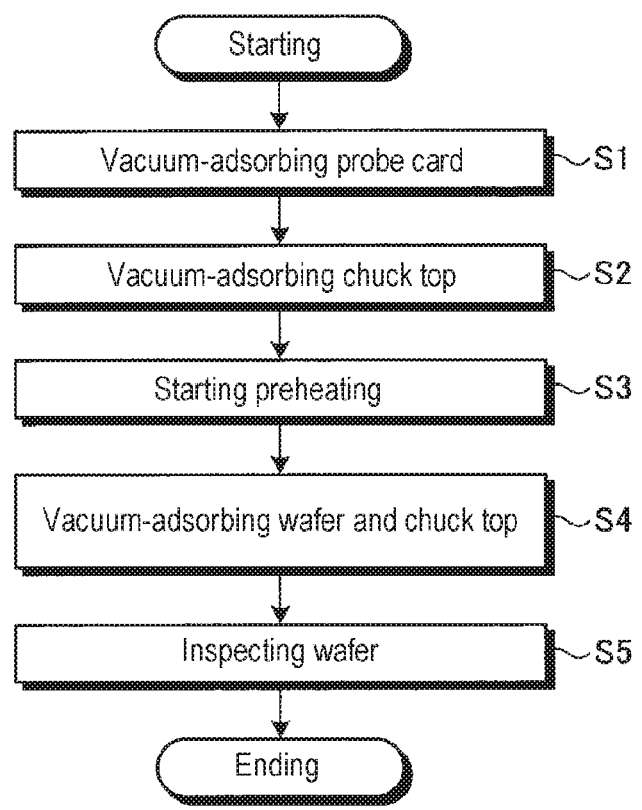
FIG. 5 is a flowchart illustrating an example of a preheating method for a probe card according to the first embodiment.

Next, a preheating method for the probe card according to the first embodiment will be described. FIG. 5 is a flowchart illustrating an example of a preheating method for a probe card according to the first embodiment.

The probe card 19 is transferred from the loader 17c to the inspection room 12a for preheating the probe card using the transfer device 18. The probe card 19 is vacuum-adsorbed to the pogo frame 20 from the transfer device 18 (step S1).

Next, the chuck top 29 is transferred to the probe card 19, which performs preheating, using the transfer device 18. At this time, a wafer is not mounted on the chuck top 29. The chuck top 29 is transferred below the probe card 19 using the transfer device 18. The chuck top 29 is raised and brought into contact with the gap adjustment members 70 of the probe card 19. Furthermore, the chuck top 29 is vacuum-adsorbed toward the probe card 19 (step S2). At this time, the gap between the chuck top 29 and the probe card 19 is kept constant by the gap adjustment members 70.

The transfer device 18 is retreated from the inspection room 12a, and preheating of the probe card 19 starts by controlling the chiller unit and the heater power source (not shown) connected to the flow passage 50 and the heater 51 (step S3).

When the preheating of the probe card 19 is completed, the chuck top 29 is transferred from the inspection room 12a using the transfer device 18, and the wafer W is mounted on the chuck top 29. The chuck top 29 on which the wafer W is mounted is transferred to the inspection room 12a, and the wafer W and the chuck top 29 are vacuum-adsorbed to the pogo frame 20 (step S4). The wafer W is inspected (step S5). After the inspection is completed, the wafer W is transferred to, for example, the port 17a, using the transfer device 18.

In this manner, the preheating of the probe card 19 can be performed while maintaining the gap between the probe card 19 and the chuck top 29 to be constant. In addition, since the gap between the probe card 19 and the chuck top 29 is kept constant, the preheating time can be stabilized and the preheating of the probe card 19 can be performed in any inspection room 12a.

[Exemplary Modification of the Gap Adjustment Member]

Figure 6:
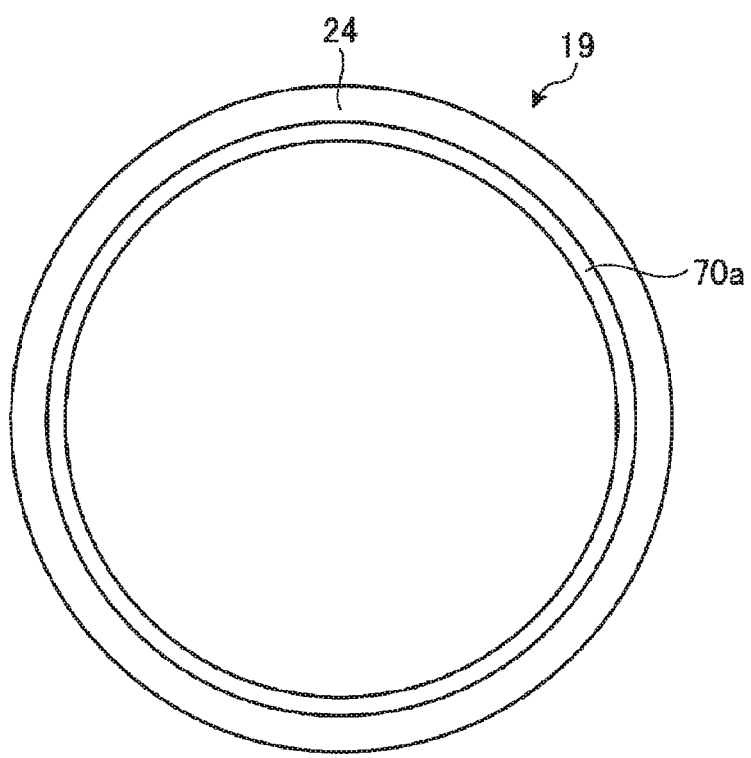
FIG. 6 is a diagram illustrating an example of a configuration of a gap adjustment member.
Figure 7:
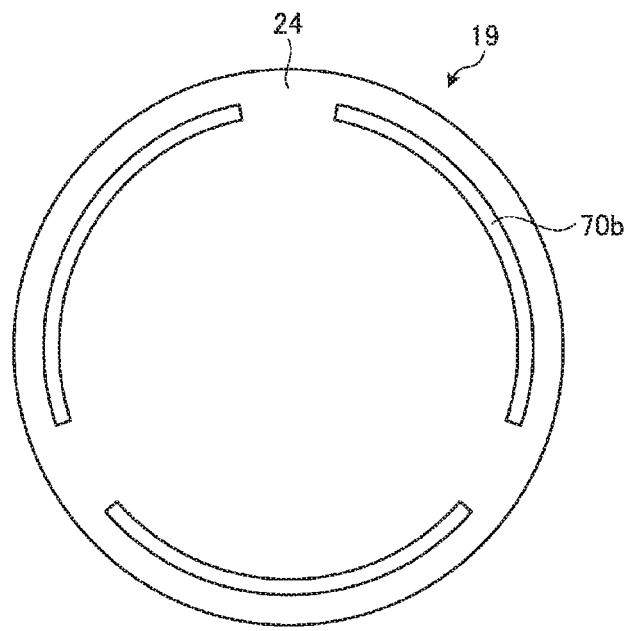
FIG. 7 is a diagram illustrating an example of a configuration of the gap adjustment member.
Figure 8:
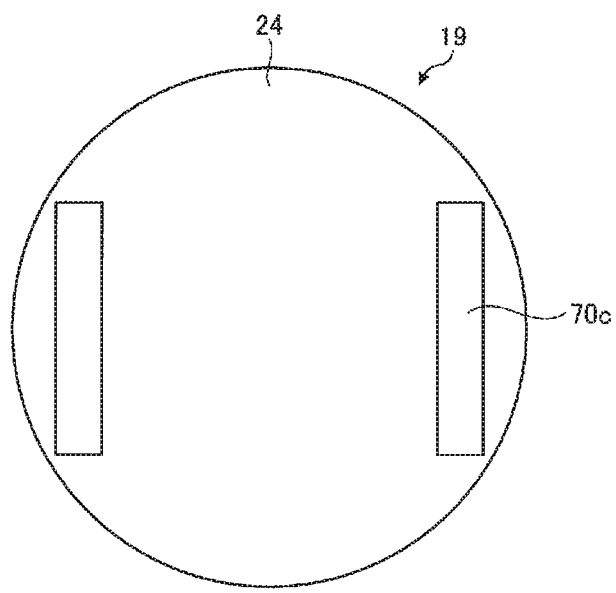
FIG. 8 is a diagram illustrating an example of a configuration of the gap adjustment member.
Figure 9:
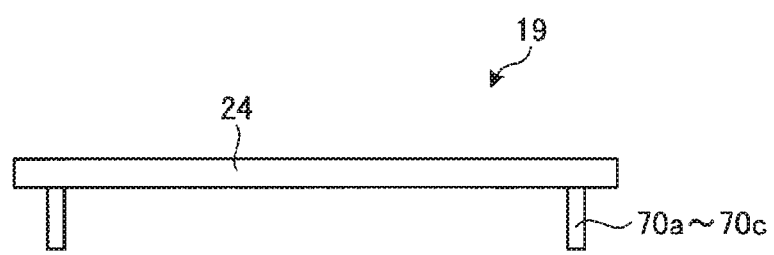
FIG. 9 is a diagram illustrating an example of a cross section of the configuration of the gap adjustment member.
Figure 10:
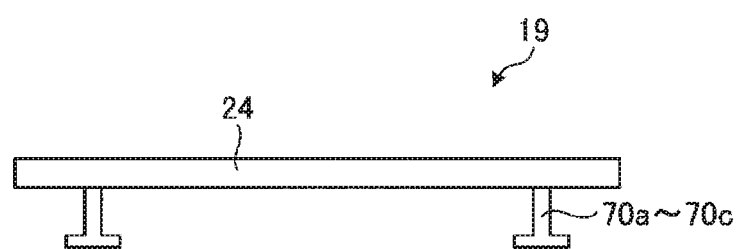
FIG. 10 is a diagram illustrating an example of a cross section of the configuration of the gap adjustment member.

Next, an exemplary modification of the gap adjustment member 70 will be described. FIGS. 6 to 8 are diagrams illustrating an example of a configuration of the gap adjustment member. FIGS. 9 and 10 are diagrams illustrating an example of across section of the configuration of the gap adjustment member. As illustrated in FIGS. 6 to 8, gap adjustment members 70a to 70c are arranged toward the front in the drawing from the lower surface of the main body 24 of the probe card 19. In the cross section of the probe card 19 illustrated in FIGS. 9 and 10, the gap adjustment members 70a to 70c are arranged downward in the drawings from the lower surface of the main body 24. The gap adjustment member 70a illustrated in FIG. 6 is an example in which the gap adjustment member 70a is arranged in an annular shape on the outer peripheral side of the probe card 19. The gap adjustment member 70b illustrated in FIG. 7 is an example in which three arc-shaped gap adjustment members 70b are arranged on the outer peripheral side of the probe card 19. The gap adjustment member 70c illustrated in FIG. 8 is an example in which two straight-shaped gap adjustment members 70c are arranged at positions linearly symmetrical from the center of the probe card 19.

FIG. 9 illustrates a cross section of the gap adjustment member, which has a straight shape. Further, FIG. 10 illustrates a cross section of the gap adjustment member, which has an inverted T shape. The modifications of the gap adjustment member 70 are not limited to the gap adjustment members 70a to 70c, and other shapes and arrangements may be used.

[Second Embodiment of the Prober Configuration]

In the first embodiment, the gap between the chuck top 29 and the probe card 19 is kept constant by the gap adjustment members 70 installed on the probe card 19, but the gap adjustment members may be installed on the pogo frame. An embodiment in this case will be described as a second embodiment of the present disclosure. The same components as those in the first embodiment are denoted by the same reference numerals and a description of the overlapping components and operations will be omitted.

Figure 11:
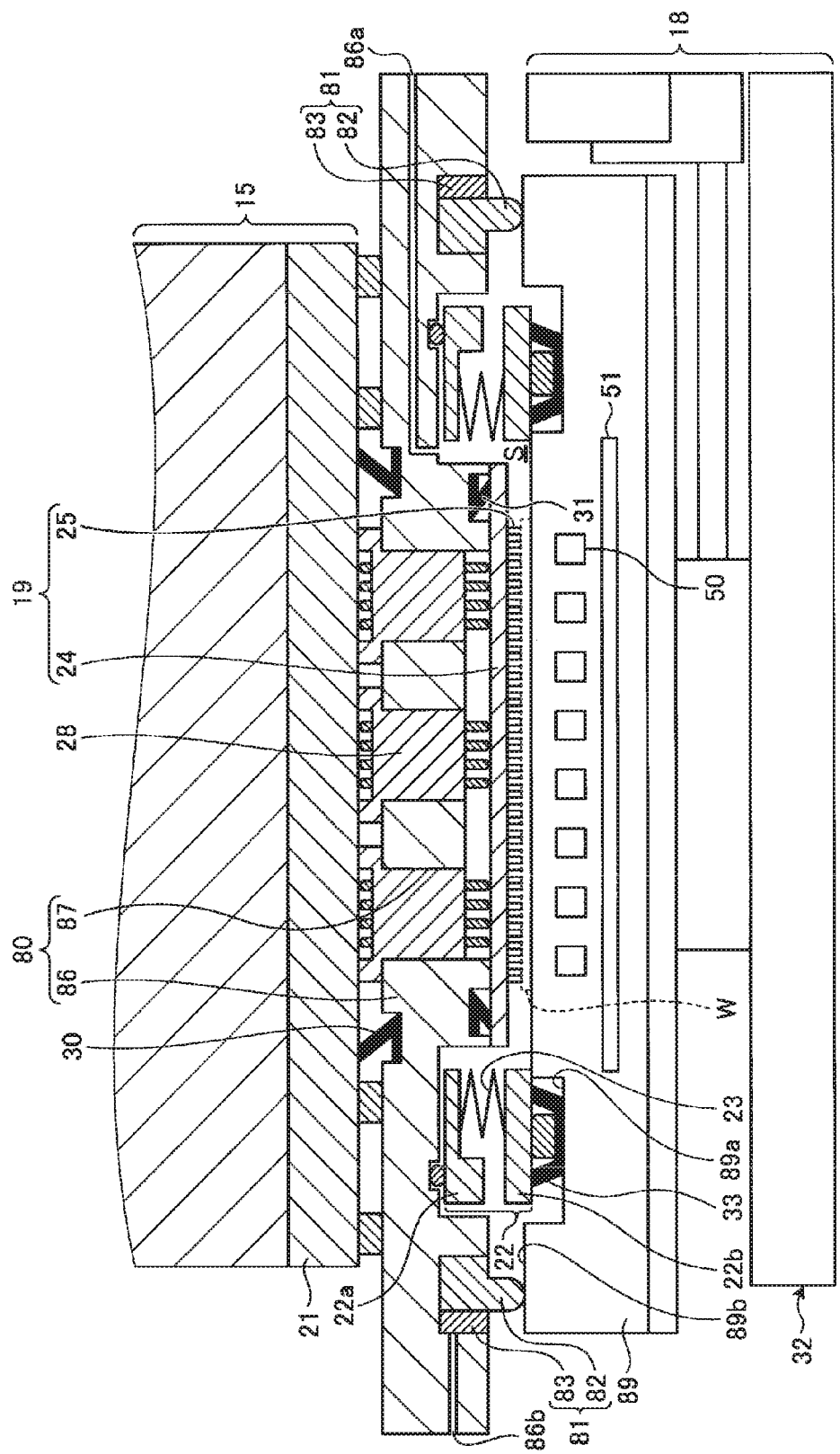
FIG. 11 is a diagram illustrating an example of a configuration of a prober when a wafer is not mounted on a chuck top according to a second embodiment of the present disclosure.

Compared with the first embodiment, the second embodiment has a pogo frame 80 and a chuck top 89 instead of the pogo frame 20 and the chuck top 29. FIG. 11 is a diagram illustrating an example of a configuration of a prober when a wafer is not mounted on the chuck top according to a second embodiment of the present disclosure. FIG. 11 illustrates a state where a wafer W is not mounted in order to preheat the probe card 19. Further, FIG. 12 is a diagram illustrating an example of a configuration of a prober when the wafer is mounted on the chuck top according to the second embodiment.

Figure 12:
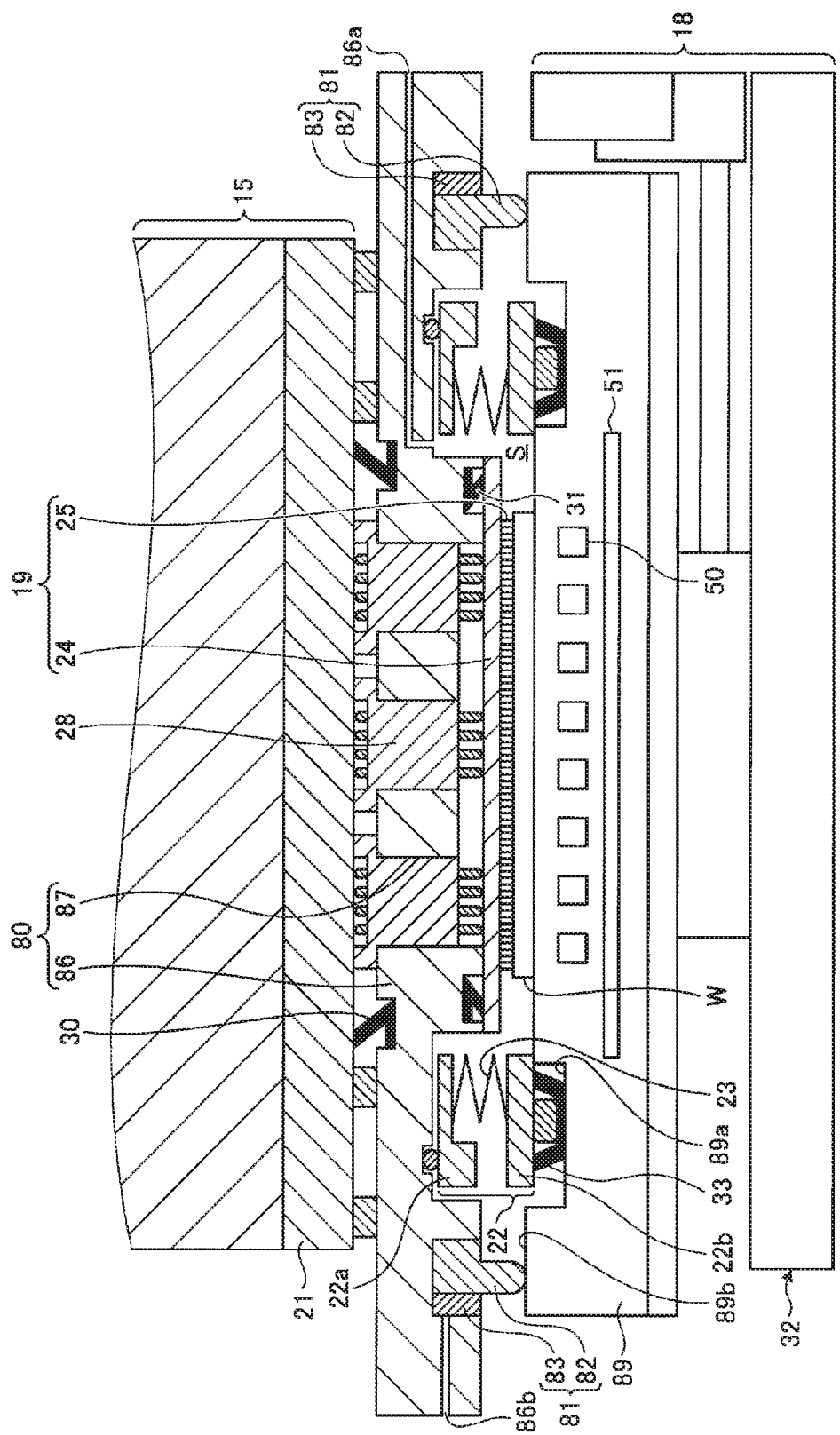
FIG. 12 is a diagram illustrating an example of a configuration of a prober when the wafer is mounted on the chuck top according to the second embodiment.

As illustrated in FIG. 11 and FIG. 12, the pogo frame 80 has a substantially flat plate-shaped body 86, and pogo block insertion holes 87 which are through holes formed to penetrate a vicinity of a central portion of the body 86. A pogo block 28 formed by arranging numerous pogo pins is inserted into each pogo block insertion hole 87. In addition, the pogo frame 80 has gap adjustment members 82 for maintaining the gap between the chuck top 89 and the probe card 19 to be constant. Furthermore, the pogo frame 80 has a vacuum line 86a for vacuuming the space S and an air line 86b for fixing the gap adjustment members 82.

The gap adjustment members 82 are freely movable in the vertical direction and can be fixed at arbitrary positions by the pressure of the air line 86b. Furthermore, gap adjuster 81 each have the gap adjustment members 82 and a distance sensor 83 for measuring a distance between the pogo frame 80 and the chuck top 89. The distance sensor 83 is, for example, a non-contact sensor such as an eddy current type.

The gap adjustment members 82 are fixed at a predetermined distance based on the distance measured by the distance sensor 83 when the chuck top 89 is vacuum-adsorbed to the pogo frame 80. The gap adjustment members 82 each may use the distance sensor 83 such that the gap adjustment members 82 are fixed respectively. Furthermore, the gap adjustment members 82 are fixed at a distance (position) where the probes 25 are not brought into contact with the upper surface of the chuck top 89 when the wafer W is not mounted on the chuck top 89 (FIG. 11). On the other hand, the gap adjustment members 82 are fixed at a distance (position) where the wafer W is brought into contact with the probes 25 when the wafer W is mounted on the chuck top 89 (FIG. 12).

The chuck top 89 is vacuum-adsorbed to the aligner 32, and the wafer W is vacuum-adsorbed to the chuck top 89. A groove 89a is formed in a peripheral portion of the upper surface of the chuck top 89, and the seal member 33 is installed in the groove 89a. Furthermore, an outermost peripheral portion 89b of the chuck top 89 has the same height as the adsorption surface of the wafer W, and the gap adjustment members 82 are brought into contact with it.

The space S is a space formed when the gap adjustment members 82 are brought into contact with the outermost peripheral portion 89b of the chuck top 89 to reach a set distance (FIG. 11), or a space formed when the chuck top 89 is brought into contact with the lower flange 22b and the wafer W is brought into contact with the probe card 19 (FIG. 12). The space S is sealed by the bellows 23 and the seal member 33. In the space S, the chuck top 89 is held and supported on the probe card 19 side by vacuuming the space S.

As described above, in the second embodiment, the probe card 19 and the chuck top 89 can be kept parallel to each other and the probe card 19 can be preheated. Furthermore, the position of the chuck top 89 when the probe card 19 is preheated can be determined.

As described above, according to the first embodiment, the prober 10 is a prober including the inspection rooms 12a, and each of the inspection rooms includes the probe card 19, the chuck top 29, and the temperature adjuster. The probe card 19 has the probes 25. The wafer W can be mounted on the chuck top 29. The temperature adjuster adjusts the temperature of the chuck top 29. Furthermore, at least one of the probe card 19 and the chuck top 29 includes the gap adjustment members 70 for maintaining the gap between the probe card 19 and the chuck top 29 to be constant. The prober 10 preheats the probe card 19 by heat of the chuck top 29 whose temperature is adjusted by the temperature adjuster, in a state in which the wafer W is not mounted on the chuck top 29 and in a state in which the probe card 19 and the chuck top 29 are connected with each other via the gap adjustment members 70. As a result, the preheating of the probe card 19 can be performed.

Furthermore, according to the second embodiment, the prober 10 is a prober including the inspection rooms 12a, and each of the inspection rooms 12a includes the probe card 19, the chuck top 89, the pogo frame 80, and the temperature adjuster. The probe card 19 has the probes 25. The wafer W can be mounted on the chuck top 89. The pogo frame 80 supports the probe card 19. The temperature adjuster adjusts the temperature of the chuck top 89. In addition, the pogo frame 80 has the gap adjustment members 82 for maintaining the gap between the probe card 19 and the chuck top 89 to be constant. The prober 10 preheats the probe card 19 by heat of the chuck top 89 whose temperature is adjusted by the temperature adjuster, in a state in which the wafer W is not mounted on the chuck top 89 and in a state in which the pogo frame 80 and the chuck top 89 are connected with each other via the gap adjustment members 82. As a result, the probe card 19 and the chuck top 89 can be kept parallel to each other, and the preheating of the probe card 19 can be performed.

According to the present disclosure in some embodiments, it is possible to preheat a probe card while maintaining a constant gap between the probe card and a chuck top.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A prober comprising inspection rooms,
   wherein each of the inspection rooms includes:
   a probe card having probes;
   a chuck top configured to mount a wafer;
   a temperature adjuster configured to adjust a temperature of the chuck top; and
   a gap adjustment member installed in at least one of a lower surface of the probe card and an upper surface of the chuck top, and configured to maintain a constant gap between the probe card and the chuck top,
   wherein the probe card is preheated by heat of the chuck top whose temperature is adjusted by the temperature adjuster, in a state in which the wafer is not mounted on the chuck top and in a state in which the probe card and the chuck top are connected with each other via the gap adjustment member.

2. The prober of claim 1, wherein a length of the gap adjustment member is longer than a length of the probe, and is shorter than the gap between the probe card and the chuck top in a state in which the probes are brought into contact with the wafer when the wafer is mounted on the chuck top.

3. The prober of claim 2, wherein the gap adjustment member has a pin shape, an annular shape, an arc shape, or a linear shape.

4. The prober of claim 1, wherein the gap adjustment member has a pin shape, an annular shape, an arc shape, or a linear shape.

5. A prober comprising inspection rooms,
   wherein each of the inspection rooms includes:
   a probe card having probes;
   a chuck top configured to mount a wafer;
   a pogo frame configured to support the probe card;
   a temperature adjuster configured to adjust a temperature of the chuck top; and
   a gap adjustment member installed in a lower surface of the pogo frame, and configured to maintain a constant gap between the probe card and the chuck top,
   wherein the probe card is preheated by heat of the chuck top whose temperature is adjusted by the temperature adjuster, in a state in which the wafer is not mounted on the chuck top and in a state in which the pogo frame and the chuck top are connected with each other via the gap adjustment member.

6. A method of preheating a probe card in a prober for inspecting a wafer, comprising:
   transferring a chuck top configured to hold the wafer and on which the wafer is not mounted below the probe card on which probes configured to bring into contact with the wafer are formed;
   adsorbing the chuck top toward the probe card; and
   preheating the probe card by heat of the chuck top in a state in which a constant gap between the chuck top on which the wafer is not mounted and the probe card is maintained by a gap adjustment member installed in at least one of a lower surface of the probe card and an upper surface of the chuck top.

* * * * *